United States Patent
Pardell Vilella

(10) Patent No.: US 9,857,450 B2
(45) Date of Patent: Jan. 2, 2018

(54) MODULE INTEGRATED SOLAR POSITION SENSING DEVICE FOR CONCENTRATION PHOTOVOLTAIC DEVICES

(71) Applicant: Ricard Pardell Vilella, Valldoreix (ES)

(72) Inventor: Ricard Pardell Vilella, Valldoreix (ES)

(73) Assignee: Ricard Pardell Vilella, Valldoreix (ES)

( * ) Notice: Subject to any disclaimer, the term of this patent is extended or adjusted under 35 U.S.C. 154(b) by 354 days.

(21) Appl. No.: 14/394,331

(22) PCT Filed: Apr. 16, 2013

(86) PCT No.: PCT/EP2013/057875
§ 371 (c)(1),
(2) Date: Oct. 14, 2014

(87) PCT Pub. No.: WO2013/156462
PCT Pub. Date: Oct. 24, 2013

(65) Prior Publication Data
US 2015/0085277 A1   Mar. 26, 2015

Related U.S. Application Data

(60) Provisional application No. 61/624,406, filed on Apr. 16, 2012.

(51) Int. Cl.
  G01B 11/26    (2006.01)
  G01S 3/786    (2006.01)
  F24J 2/38     (2014.01)
  H01L 31/054   (2014.01)
  H02S 20/32    (2014.01)

(52) U.S. Cl.
  CPC ............. *G01S 3/7861* (2013.01); *F24J 2/38* (2013.01); *H01L 31/0543* (2014.12); *H02S 20/32* (2014.12); *Y02E 10/47* (2013.01); *Y02E 10/52* (2013.01)

(58) Field of Classification Search
  CPC ........... F24J 2/38; G01S 3/7861; Y02E 10/47; Y02E 10/52
  USPC ..................................... 356/139.02
  See application file for complete search history.

(56) References Cited

U.S. PATENT DOCUMENTS

| 8,581,164 B2* | 11/2013 | Wu ................. G01S 3/7861 126/573 |
| 2010/0059042 A1 | 3/2010 | Chang et al. |
| 2010/0126556 A1 | 5/2010 | Benitez et al. |
| 2011/0174359 A1 | 7/2011 | Goei et al. |
| 2012/0167871 A1* | 7/2012 | Falbel ....................... F24J 2/38 126/576 |
| 2012/0305077 A1* | 12/2012 | Arab ........................ F24J 2/085 136/259 |
| 2013/0019920 A1* | 1/2013 | Kinsey .............. H01L 31/0543 136/246 |
| 2013/0081668 A1* | 4/2013 | Linderman ............... F24J 2/38 136/246 |

FOREIGN PATENT DOCUMENTS

DE    10 2009 058135 A1    6/2011

OTHER PUBLICATIONS

International Search Report for corresponding patent application No. PCT/EP2013/057875 dated Jan. 22, 2014.

* cited by examiner

*Primary Examiner* — Mark Hellner
(74) *Attorney, Agent, or Firm* — Renner, Otto, Boisselle & Sklar, LLP

(57) ABSTRACT

The present invention refers to a sensing device for sensing the alignment with respect to the sun of a concentration photovoltaic CPV device of the type which comprises at least one principal optical element POE and a CPV receiver, a CPV system, or module, comprising a CPV receiver and an integrated sensing device, and an optimized method for aligning a concentration photovoltaic CPV system with respect to the sun.

17 Claims, 6 Drawing Sheets

MODULE INTEGRATED SOLAR POSITION SENSING DEVICE FOR CONCENTRATION PHOTOVOLTAIC DEVICES

This application is a national phase of International Application No. PCT/EP2013/057875 filed Apr. 16, 2013 and published in the English language, which claims the benefit of U.S. Provisional Application No. 61/624,406 filed Apr. 16, 2012.

TECHNICAL FIELD

The present invention relates generally to the field of concentration photovoltaic CPV devices and systems, and more particularly to the fine tuning of solar tracking control systems in CPV systems.

BACKGROUND OF THE INVENTION

Concentration photovoltaic CPV technology uses optics such as lenses or curved mirrors to concentrate a large amount of sunlight onto a small area of solar photovoltaic PV cells to generate electricity. They therefore function under high concentration of light (normally more than 100 suns).

Compared to non-concentrated photovoltaic systems, CPV systems can save money on the cost of the solar cells, since a smaller area of photovoltaic material is required. As a smaller PV area is required, CPVs can use higher-efficiency solar cells. To get the sunlight focused on the small PV area, CPV systems require costly optics (lenses or mirrors), solar trackers, and cooling systems. Because of these additional costs, CPV is far less common today than non-concentrated photovoltaic.

FIG. 7 depicts an exemplary CPV system 700 of the prior art composed of at least one CPV device 710 for receiving and converting the received light energy into electrical energy. In essence the CPV device is a photoelectrical transducer. Additionally, CPV systems comprise external solar position sensors 720 in order to aid them in aligning correctly with the constantly changing sun position. The sensor transmits the solar position information via link 730.

A CPV device usually comprises at least one primary optical element POE that concentrates incoming light onto at least one CPV receiver. Current systems typically comprise a plurality of POEs and CPV receivers. Additionally, as mentioned before, CPV devices comprise solar trackers in order to keep the CPV device aligned with respect to the sun, as an accurate aligning with respect to the sun is critical for the device performance.

In the development of CPV systems there have been many different approaches for the fine tuning of solar tracking control systems. Some concentration tracking systems only work in open loop, but the vast majority of them follows a hybrid or purely closed loop tracking algorithm. While open loop systems rely on astronomical calculations to keep the CPV device correctly aligned, close loop systems use feedback signals or images coming from the solar position sensor, or camera, and therefore require following the sun along two axes with high accuracy.

The hybrid type comprises a combination of open and closed loop tracking, in other words, the hybrid algorithms rely partially in both astronomical calculations and the feedback signals provided by external sensors. These external sensors need a precise alignment with the CPV device's optical axis in order to work properly. As the objective of the tracker system is to align the CPV devices with respect to the sun, any slight mechanical misalignment between the sensor and the modules downgrades the overall performance of the CPV system. The requirement for field alignment increases deployment costs and increases the probability of having recurrent problems. If the sensor has to be calibrated to each tracking system then this procedure is critical and it can be prone to develop mechanical misalignment, requiring periodical maintenance.

Another common problem for solar position sensors of the prior art is that they can be fooled by clouds or ground reflections, therefore misleading the tracking control algorithm actually making it follow other objects, and therefore losing energy productivity.

Additionally, external solar sensors must rely on small aperture optics in order to minimize its impact on the overall CPV module's solar aperture, so that they are prone to be affected by dirt stains or soiling.

Yet another problem of known solar position sensor designs for CPV systems is that they have a very narrow acceptance, in such a way that if the sun does not lie within its angle of vision they are not able to correct the misalignment. This means that under some failure modes these sensors are not able to help the system recover its right position.

Also, these external sensors constitute completely redundant optical systems working in parallel with the CPV module optics. Having a different optical system makes it difficult to match the CPV module's characteristics and implies a redundancy of components which is not optimal and increases system costs. A CPV system is necessary that does not need redundant optical systems and does not have an impact on the CPV's solar aperture The present invention has the goal of solving the aforementioned problems, by means of increasing tracking system reliability and reducing manufacturing, commissioning, operation and maintenance costs.

SUMMARY

It is therefore an object of the present invention to provide solutions to the above mentioned problems. In accordance with one or more embodiments and corresponding disclosures thereof, various aspects are described in connection with optimizing the fine tuning of solar tracking control systems in CPV systems.

One embodiment of the invention refers to a sensing device for sensing the alignment with respect to the sun of a concentration photovoltaic CPV device comprising at least one principal optical element POE.

Another embodiment of the invention refers to a concentration photovoltaic CPV system comprising a CPV device and an integrated sensing device for sensing the alignment with respect to the sun of the concentration photovoltaic CPV device.

Another embodiment of the invention refers to a method of aligning a CPV device using a sensing device for sensing the alignment with respect to the sun of a concentration photovoltaic CPV device.

Another embodiment of the invention refers to a computer readable medium comprising instructions which, when executed in a computer, perform the steps of a method for the optimized fine-tuned alignment of a CPV system.

The different disclosed aspects therefore refer to a solar position sensor which is integrated into a concentrated photovoltaic module having refractive, diffractive or hybrid primary imaging optics or, even more generally, imaging optics in which the primary lies between the sun and the CPV receiver.

The present invention aims at solving the problems of the prior art by increasing tracking system reliability and reducing manufacturing, commissioning and operation and maintenance costs. The CPV module of the present invention is module integrated, thereby avoiding the need of complex sensor to module alignment procedures which are needed for systems relying on an external (i.e. non-module integrated) solar position sensor.

While eliminating the need for such calibration procedures reduces CPV system installation and commissioning costs, it also increases system reliability, as there is no accidental misalignment possibility between sensor and CPV modules.

Additionally, as it is integrated in the module, it uses the primary optical element POE of one of the CPV receivers for the positioning function and the module enclosure for the device protection, thus reducing component redundancy and cost.

Another advantage is that the sensor works under concentrated light, so that its working illumination threshold can be correlated to significant direct normal irradiance DNI conditions, in such a way that its function is not disturbed by cloud reflections or diffuse light.

Another advantage is that it uses the full POE area and optics creating an image of the sun in the focal plane, so that even if dirt partially obscures the POE aperture, it will still work and thus its function will be less prone to be affected by soiling or dirt stains.

Another advantage is that the MISPS is made of silicon photovoltaic cells which can be obtained from standard mono or poly crystalline wafers, therefore having a very low cost.

Another advantage is that its configuration, divided in two sensor areas, delivers a very good sensitivity to small deviations combined with a wide acceptance angle. The central section of the sensor, made of small cells, provides good response to small deviations, while the very large area of the peripheral section of the sensor provides a large acceptance angle. For instance, a f1 optical system it is expected to offer a 0.1 to 17 degrees response range. A wide sensor acceptance will allow relaxing installation and commissioning alignment requirements and will help the tracking system to recover more easily from different kinds of incidences.

The invention provides methods and devices that implement various aspects, embodiments and features, and are implemented by various means. For example, these techniques may be implemented in hardware, software, firmware, or a combination thereof.

BRIEF DESCRIPTION OF THE DRAWING(S)

The features and advantages of the present invention become more apparent from the detailed description set forth below when taken in conjunction with the drawings in which like reference characters identify corresponding elements in the different drawings. Corresponding elements may also be referenced using different characters.

DETAILED DESCRIPTION OF THE INVENTION

Figure 8:
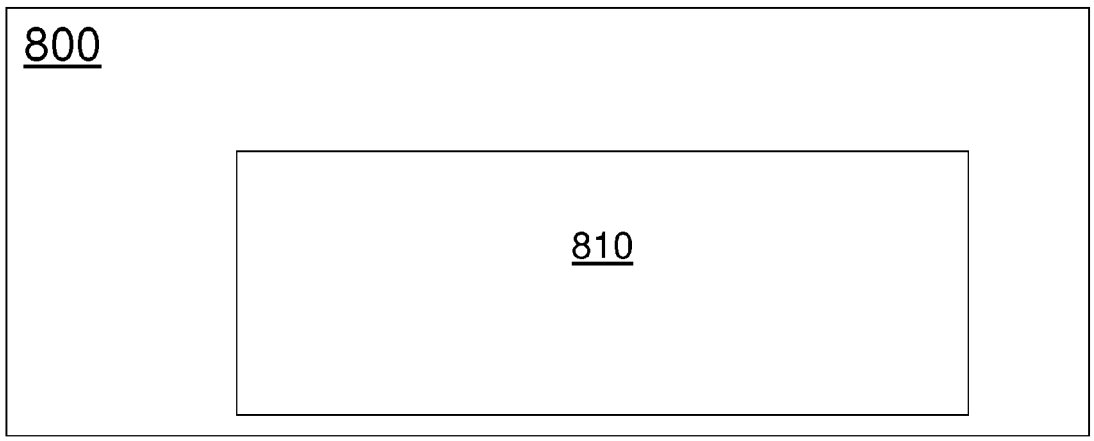
FIG. 8 depicts a CPV system of the present invention.

FIG. 8 is a general overview of a CPV system 800 according to one embodiment of the present invention. The CPV system 800 comprises a CPV device 810 and a sensing device 820, or module integrated solar position sensor MISPS, integrated within a single module. In other words, the sensing device is integrated within the CPV device.

Figure 1:
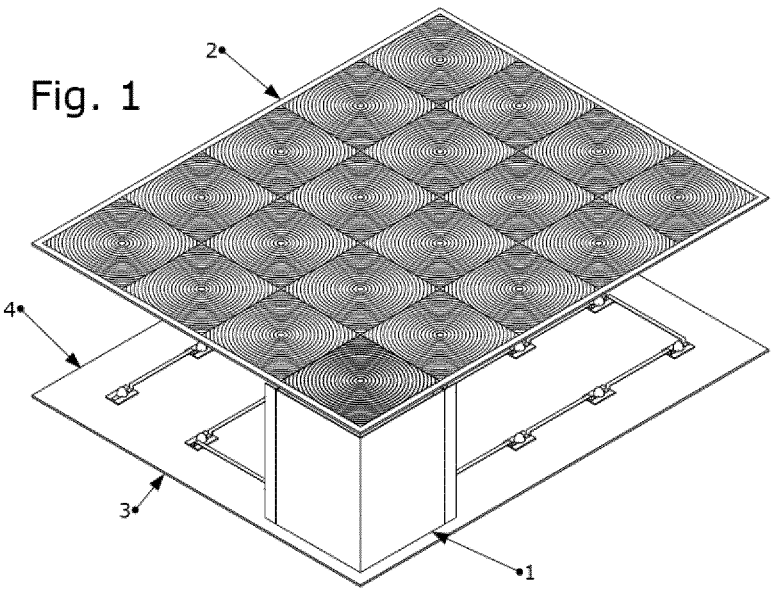
FIG. 1 depicts a general overview of the CPV system according to one embodiment of the present invention.

FIG. 1 is another view of the CPV system, or module, according to one aspect of the present invention. The sensing device 1 is integrated within the CPV device, together forming a single module. The sensing device is located in between a panel composed of a plurality of primary optical elements POE 2 and a receiver panel 3 comprising a plurality of CPV receivers 4. In order to allow the internal components to be shown, the CPV module walls have been omitted. It can be observed that the plane formed by the plurality of POE elements 2 and the receiver panel 3 are parallel to each other. The sensing device is installed on top of one of the CPV receivers 4.

Figure 2:
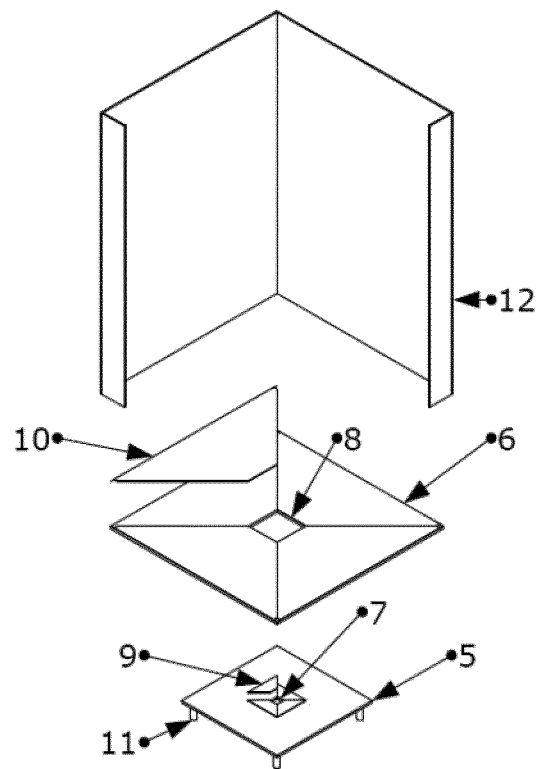
FIG. 2 depicts an exploded view of the sensing device according to another embodiment of the present invention.
Figure 3:
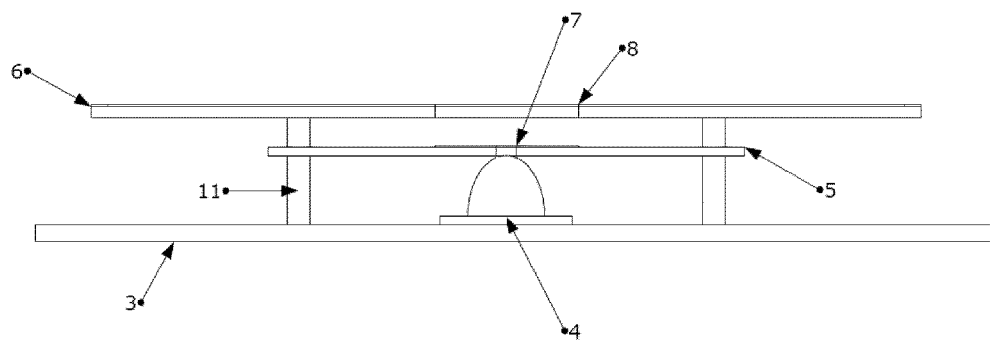
FIG. 3 shows a cross section view of the sensing device components.

FIGS. 2 and 3 show, respectively, an exploded view and a cross sectional view of the sensing device of the invention, together with its components. In one aspect, the sensing device comprises two such sensing sections: a central section 5 and a peripheral section 6. Both sections are arranged in such a way that they jointly cover a surface area close to that of the POE aperture. Central section 5 consists of a plurality of photovoltaic cells 9 placed in a cross arrangement mounted on a substrate. One exemplary substrate is an insulated metal substrate IMS circuit, although other substrates can be used as well.

Central section 5 has four standoff inserts 11, and is bolted through them to the CPV module back plate 3. It is mounted coplanar to the CPV module back plate, centered on one of its receivers 4, in such a way that receiver's secondary optical element's SOE geometrical and sensor diaphragm centers are aligned. The four triangular cells 9 may be connected to a plurality of shunt resistors, in order to allow measurement of the short circuit current of each sensor cell. The shunt resistors and any other electronic circuitry are arranged around the plurality of solar cells. Each cell 9 is triangular in shape with a truncated corner. The four triangular cells, when mounted, leave a square empty area between them which must be coincident with the diaphragm aperture on the IMS circuit. This empty area is the central hole of the central section.

As it can be observed in FIG. 2, the central section substrate circuit has a square hole 7 in its center (also referred to as diaphragm), of a width which is just a bit larger than the diameter of the sun image on the POE focal plane (also referred to as sun spot). The substrate circuit is mounted so that its upper surface (the sensor cells) is as close as possible to the POE focal plane.

Peripheral section 6 surrounds the central section and is mounted on top of it. It also consists of a plurality of photovoltaic cells 10 placed in a diagonal cross arrangement, but these cells are significantly larger than the ones in the central section and the substrate on top of which are mounted can be for instance a FR4 printed circuit board instead of an IMS board. The plurality of photovoltaic cells 10 are truncated in such a way that the dead space left between them in the center is coincident with a square aperture on the peripheral circuit board which is of the same area as the central section sensor area. This empty area is the peripheral hole of the peripheral section.

Peripheral section 6 also has its four triangular cells connected to a plurality of shunt resistors to allow measurement of the short circuit currents and it is mounted through mechanical and electrical connectors on top of the central section, so that voltage signals coming from the central section are connected to the peripheral section by means of these mounting connectors. Peripheral section 6 is implemented using a double sided circuit, so that the shunt resistors and remaining electronics can be surface mounted SMD on the back side of the board while the sensor cells are mounted on the front side. In order to transmit the voltage signals to the control electronics, connectors are placed on the edge of the back side of the peripheral sensor.

As can be seen from these drawings, the sensing device 1 is formed out of a common element. The common element is a photovoltaic sensing section composed in such a manner that it has a hole in its center. If the sensing device is aligned with the impinging sunlight, all, or substantially all of the sun's light will pass through this element's hole, or aperture. Hence no current, or signal will be generated. A sensor signal is generated only once, due to misalignment, the sun impinges outside the hole and is therefore sensed by the photoelectric sensing element. However in a different configuration two of these common sensing elements may be combined, as long as their apertures are aligned, in order to follow the same light sensing principle: a signal is generated only once the sensing device is not aligned with the sun.

In principle the kind of cells to be used can be obtained from a standard mono-crystalline silicon wafer but the concept can be implemented using any kind photovoltaic cell which tolerates high current densities. Nevertheless, for an optimal operation, an increased metallization density is desirable, much higher than the standard metallization for silicon photovoltaic cells designed to work at one sun, as the cell has to work under concentrated irradiance and its photocurrent conversion efficiency is of no interest because it is used as a sensor and not as a power generator. An increased metallization density will reduce series resistance and recombination losses originated by extreme current densities, avoiding current saturation effects which would originate a non-lineal current response to irradiance: The higher the metallization density the lower the amount of photons that will be converted and the lower the series resistance of fingers. Desired metallization pattern consists in a bus bar parallel to the longest side of the sensor cell and fingers running perpendicular to it.

Additionally, the aperture is surrounded by four light blocking walls 12, normal to the POE focal and aperture planes, in such a way that these walls are of a height similar to the POE focal length and of a width similar to the POE square solar aperture. It should be noted that FIG. 2 shows only two of the four walls surrounding the sensing devices. The function of these walls is to avoid interference between the sensing device and light coming from POEs corresponding to other receivers. The walls should be as black as possible in order to avoid reflections which could mislead the sensor.

In a preferred embodiment of the invention, the receiver 4 at which the sensor is centered is preferably one close to the systems mechanical center, thus being more representative of the mean mechanical alignment vector of all system receivers.

It should be noted, that the drawings depict the four cells as triangular cells and that four cells have been used in each section (central and peripheral). This is merely exemplary, and not limiting, and intends to show preferred embodiment of the invention. More or less sections can be used, depending upon the desired accuracy of the alignment process and their shape can change depending thereupon.

Figure 4:
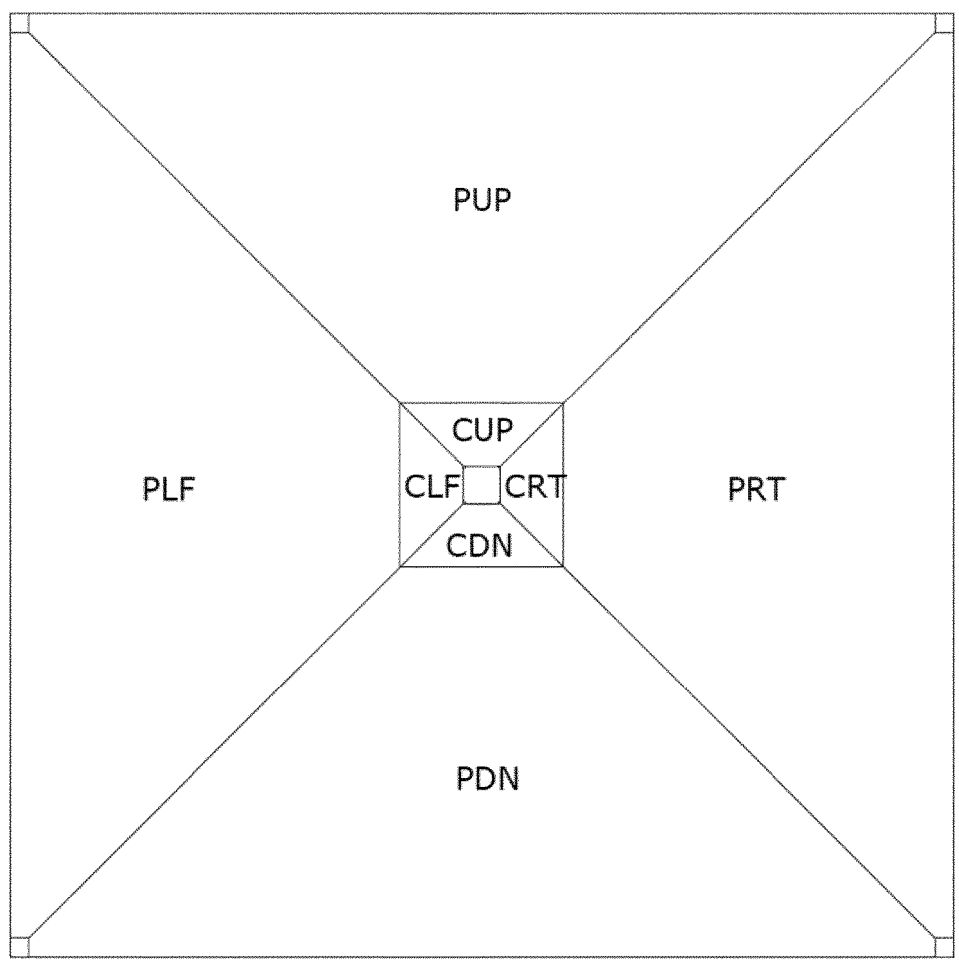
FIG. 4 shows a top view of the sensing device of the present invention.

FIG. 4 shows a top view of the combined central and peripheral sensing sections. It can be observed that the combined sensor is divided in two sections (central and peripheral), each of them divided in four quadrants (up, down, left and right), adding up to a total of eight sensor areas: central up CUP, peripheral up PUP, central down CDN, peripheral down PDN, central left CLF, peripheral left PLF, central right CRT and peripheral right PRT. The sensor is designed to periodically check the tracking speed and direction of each axis, instead of the absolute position.

Figure 5:
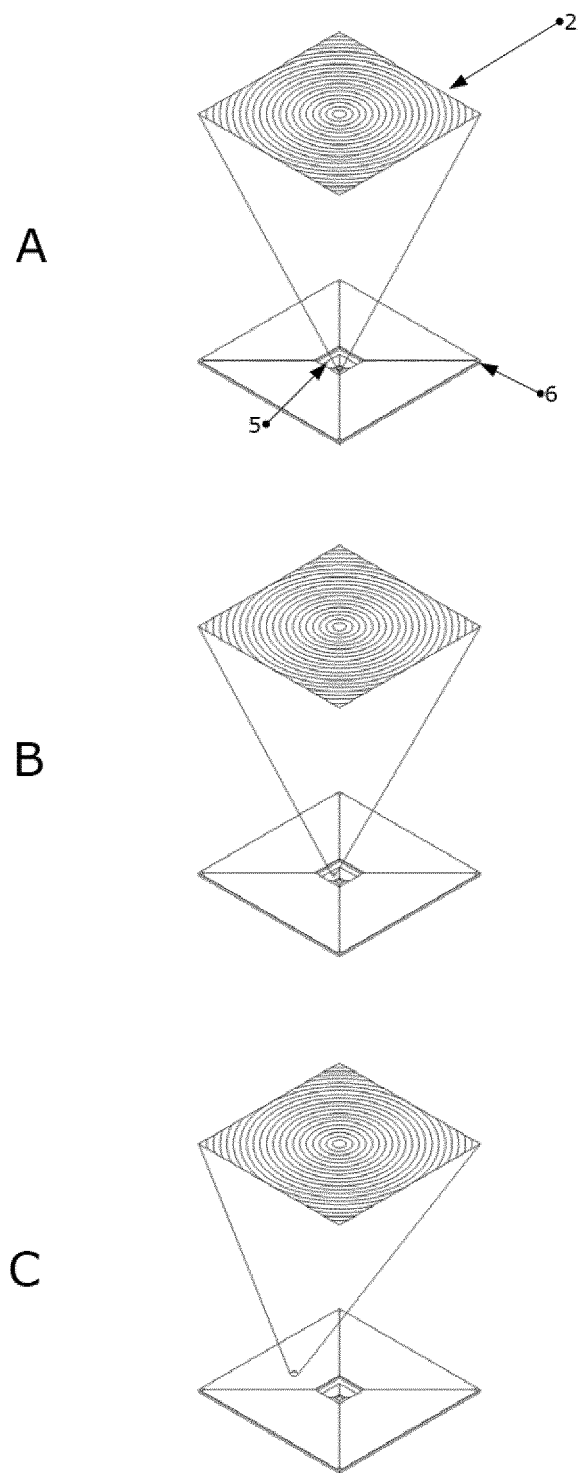
FIGS. 5A, 5B and 5C show an exemplary operation of the CPV system.

FIG. 5 depicts different alignment scenarios of the sensing device in operation. POE 2 creates an image of the sun on its focal plane. When the CPV system is perfectly aligned, the sun spot lies in the center of the SOE aperture, and therefore within central section 5 diaphragm aperture (FIG. 5A). Under perfect conditions, if no misalignment appears, the MISPS sensing device will never generate a signal strong enough to affect the open-loop mode, but when this happens, the action will be to increase or decrease the tracking speed of the affected axis.

As soon as there is misalignment, the sun spot will move away from the center of the SOE aperture, and eventually will start to hit the surface of one or two of the plurality of sensor cells on central section 5 (FIG. 5B).

If the deviation increases the sun spot will eventually move away from the central section 5 to the peripheral section 6 (FIG. 5C). As a consequence, the amount of DNI reaching the plurality of photovoltaic cells 9 will be lower than desired and the misalignment will have pernicious consequences in the energy producing capabilities of the CPV system.

In order to reduce the misalignment, the short current generated by each of the plurality of sensor cells (half on the central section and half on the peripheral section) is continuously monitored. These signals are used as a measure of the amount of DNI reaching each cell surface. Whenever the current exceeds a certain threshold, the open-loop tracking operating mode will be modified by the sensor signal and the intensity of the signals (voltages) will be used to change the tracking speed for each axis. It must be noted how the two sensor sections arrangement allows a larger sensitivity (gain) of the central section. We must take into account that any of the sensor areas will normally (i.e. when no deviation occurs) be illuminated by stray rays coming from the primary optics, with an illumination distribution similar to the equivalent of diffuse radiation per sensor area. This diffuse illumination means that the sensor cells will actually generate photocurrent proportional to its area and to diffuse radiation.

A desired characteristic of the MISPS sensing device is that it must be very sensitive to slight deviations, in the 0.1 degrees range. Even such a small deviation would place the sun spot within one of the central section sensor cells, in such a way that the increase of current would also be small. The smaller the central sensor cell area is, the lower the diffuse radiation generated current (noise) and the larger the capacity for the control algorithm to discriminate an increase of signal due to a small deviation. At the same time, having large area cells for the peripheral section provides for a very large acceptance sensor. Under very large deviations the sun spot will completely lay outside of the diaphragm and the full DNI illumination allows discriminating noise from the larger peripheral sensor cells. Therefore, reducing the central section area increases sensor sensitivity to small deviations and enlarging the peripheral section area broadens the sensor acceptance angle. As a consequence, dividing the sensor in two areas allows the MISPS sensing device to combine high sensitivity with large acceptance.

Depending upon where the sun spot is detected, the system will react accordingly in order to realign, if needed, the CPV system towards the sun. In case that the sun spot is detected in the peripheral section then the algorithm hunts the sun at constant speed, as reflected in the previous algorithm (e.g. speed A=−hunt speed). When the sun spot is detected in the central section, the speed tracking algorithm is essentially hybrid, and there is actually no significant machine state change between the perfectly aligned and the slightly misaligned situations.

Figure 6:
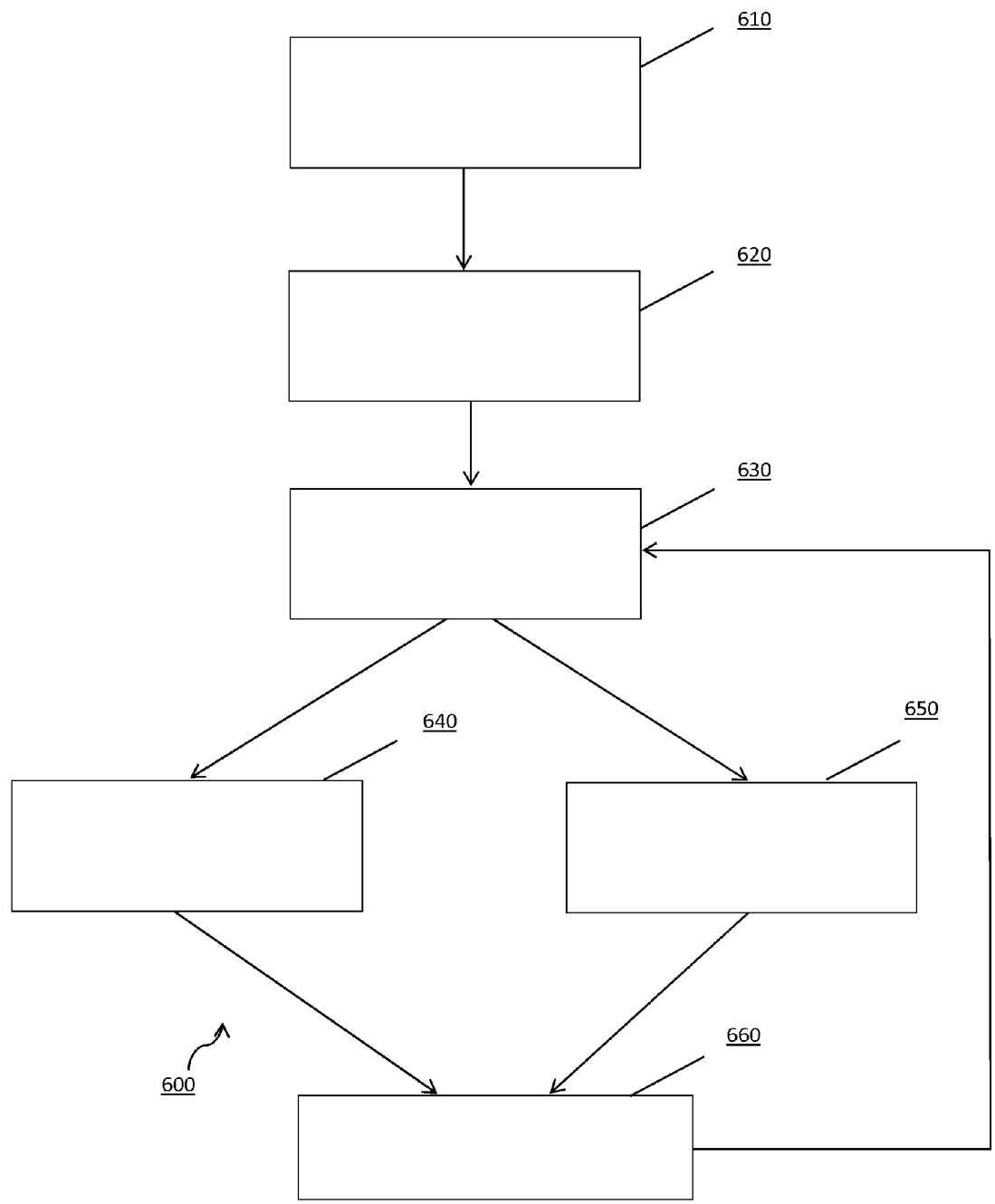
FIG. 6 shows a flow diagram of an exemplary operation of the CPV system of the present invention.
Figure 7:
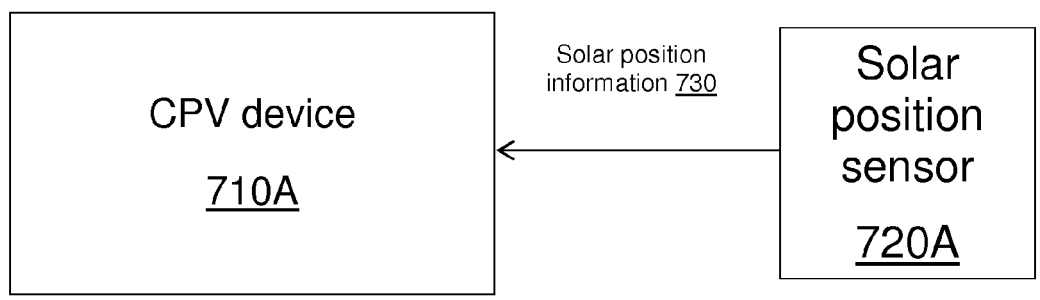
FIG. 7 depicts an exemplary CPV system of the prior art using an external sensor.

FIG. 6 depicts a method of tracking the sun according to one embodiment of the invention. In step 610, the current alignment towards the sun is measured to subsequently, in step 620, align the CPV system to an initial position. In a subsequent step, 630, the DNI received on each of the central cells 9 and on each of the peripheral cells 10 is measured. This can be implemented by measuring the short circuit currents of a plurality of shunt resistors connected to the plurality of cells of a concentration photovoltaic CPV system.

Depending upon which one(s) of the cell(s) PUP, PDN, PLF, PRT, CUP, CDN, CLF, CRT has detected a DNI exceeding a predetermined threshold, the movement speed along two different axes is modified in subsequent steps in order to re-align the CPV system. If a DNI over a first predetermined threshold is detected in one or more of the peripheral cells, in step 640, the vertical and/or horizontal movement speed is incremented/decremented a first predetermined amount in order to re-align the CPV system correctly towards the sun. Alternatively, in step 650, if a DNI over a second predetermined threshold is detected in one or more of the central cells, the vertical and/or horizontal movement speed is incremented/decremented a second predetermined amount in order to re-align the CPV system correctly towards the sun. Then, after a predetermined amount of time, the measuring of the DNI is performed again and the steps 640 or 650 are executed again depending once more upon the measurement's result.

Once implemented in software, the pseudo-code of the main running algorithm for the tracking system using the MISPS will then be similar to the one of Table I.

TABLE I

```
forever {
    while time < dawn do nothing
    initial position = calculate astronomical sun position
    move to initial position
    while time < sunset {
        periphery = false
        read MISPS signals into PUP, PDN, PLF, PRT, CUP, CDN,
        CLF, CRT
        if PUP > peripheral threshold
            speed A = − hunt speed; periphery = true
        if PDN > peripheral threshold
            speed A = + hunt speed; periphery = true
```

TABLE I-continued

```
        if PLF > peripheral threshold
            speed B = − hunt speed; periphery = true
        if PRT > peripheral threshold
            speed B = + hunt speed; periphery = true
        if ! periphery {
            speed A = calculate astronomical speed A axis
            speed B = calculate astronomical speed B axis
            if PUP > central threshold
                speed A = speed A − tune increment
            if PDN > central threshold
                speed A = speed A + tune increment
            if PLF > central threshold
                speed B = speed B − tune increment
            if PRT > central threshold
                speed B = speed B + tune increment
        }
        set speed A axis ( speed A )
        set speed B axis ( speed B )
        wait period milliseconds
    }
}
```

The speed is recalculated every period milliseconds. The sign convention affects the whole algorithm. For instance, for the B axis, assuming an alt-azimuth tracker on the northern hemisphere, when the sun spot enters the right quadrant it means that the sun is actually faster than the tracker in its east-west (left-right) azimuth speed, leaving the tracker behind. The tracking speed for B axis must therefore be increased in order to allow the tracker to catch up with the sun. Given the sign convention shown in Table 1, we must add k*inc B to speed B in order to actually increase the tracking speed. Also the B axis speed has a sign stating the direction and that the convention is positive for east-west azimuth. Imagine now that on a similar northern hemisphere alt-azimuth system, tracking before solar noon (positive astronomic elevation speed), the sun spot enters the down quadrant, this meaning that the tracker has overtaken the sun in its upwards A axis trajectory. The solution must be to lower the elevation tracking speed proportionally to inc A, and thus its sign must be also negative.

Those skilled in the art should appreciate that the foregoing discussion of one or more embodiments does not limit the present invention, nor do the accompanying drawings. Rather, the present invention is limited only by the following claims.

The invention claimed is:

1. A sensing device for sensing the alignment with respect to the sun of a concentration photovoltaic (CPV) device comprising at least one principal optical element POE and a CPV receiver, the sensing device comprising at least one photovoltaic sensing section comprising a hole, and wherein the at least one sensing section is placed between the POE and the CPV receiver such that substantially all the concentrated sunlight passes through the hole and impinges the CPV receiver once the CPV device is perfectly aligned with respect to the sun.

2. A sensing device for sensing the alignment with respect to the sun of a concentration photovoltaic (CPV) device comprising at least one principal optical element (POE) and a (CPV) receiver, the sensing device comprising at least one photovoltaic section comprising a hole, and wherein the at least one photovoltaic section is placed between the POE and the CPV receiver such that substantially all the sunlight passes through the hole and impinges the CPV receiver once the CPV device is perfectly aligned with respect to the sun, wherein the at least one photovoltaic section comprises a plurality of cells mounted on a substrate, each cell comprising a truncated corner, and wherein a hole is formed in the center once all cells are arranged together.

3. The sensing device of claim 2, comprising:
a first section of the at least one section, defining a central area with a central hole;
a second section of the at least one section, defining a peripheral area with a peripheral hole;
wherein the peripheral hole is coincident with central hole forming together a sensing device aperture; and
wherein the first and second sections are arranged in such a way that they allow substantially all the sunlight to pass through the sensing device aperture to the CPV receiver once the CPV device is perfectly aligned with respect to the sun.

4. The sensing device of claim 3, wherein the first and second sections jointly cover an aperture surface area of the at least one POE.

5. The sensing device of claim 3, wherein the plurality of central cells of the first section are placed in a cross arrangement and wherein the central hole has a width marginally larger than the diameter of the sun image on the POE focal plane.

6. The sensing device of claim 3, wherein the second section is mounted on top of the first section and surrounds it, and wherein the plurality of peripheral cells of the second section are placed in a diagonal cross arrangement, and wherein the peripheral cells are larger than the central cells.

7. The sensing device of claim 1, wherein the plurality of central and peripheral cells are each connected to a shunt resistor for measuring the short circuit current of each cell.

8. The sensing device of claim 1, further comprising means for blocking light comprising four light blocking walls normal to the POE focal and aperture planes.

9. The sensing device of claim 2, wherein the central and peripheral cells are cells with an increased metallization density.

10. A concentration photovoltaic (CPV) system, comprising:
a CPV device comprising at least one CPV receiver and at least one principal optical element (POE) lying between the sun and the at least one CPV receiver;
a sensing device for sensing the alignment with respect to the sun according to claim 1, wherein the sensing device is integrated into the CPV device, centered on top of one of the at least one CPV receivers; and
a tracker for aligning the CPV device with respect to the sun based upon alignment information of the sensing device.

11. The concentration photovoltaic (CPV) system of claim 10, wherein a central section of the sensing device is mounted coplanar to the CPV receiver in such a way that the receiver's secondary optical element (SOE) and a sensing device aperture are aligned.

12. A method for aligning a concentration photovoltaic (CPV) system with respect to the sun, the method comprising:
determining an astronomical sun position;
moving the CPV system to an initial position; and
continuously correcting the alignment of the CPV system by:
determining a current CPV system position by measuring the direct normal irradiance (DNI) on each of a plurality of cells of at least one photovoltaic section of an integrated sensing device according to claim 1; and
modifying a current tracking speed of the CPV system based on the determination.

13. A method for aligning a concentration photovoltaic (CPV) system with respect to the sun, the method comprising:
determining an astronomical sun position;
moving the CPV system to an initial position; and
continuously correcting the alignment of the CPV system by:
determining a current CPV system position by measuring the direct normal irradiance (DNI) on each of a plurality of cells of at least one photovoltaic section of an integrated sensing device; and
modifying a current tracking speed of the CPV system based on the determination, and wherein:
the current tracking speed is modified to a first predetermined amount depending upon a DNI over a first predetermined threshold being detected in one or more of the plurality of peripheral cells of the sensing device peripheral section;
the current tracking speed is modified to a second predetermined amount depending upon a DNI over a second predetermined threshold being detected in one or more of the plurality of central cells of the sensing device central section; and
waiting for a predetermined amount of time before measuring DNI on each of the plurality of central and peripheral cells and performing corresponding speed modifications.

14. The method of claim 12, wherein measuring the DNI on each of the plurality of cells comprises measuring the short circuit currents of a plurality of shunt resistors connected to the plurality of cells of the CPV system.

15. A computer program product embodied in a tangible medium, the program product comprising program instructions which, when executed in a computer, perform the method steps of claim 14.

16. A computer program product embodied in a tangible medium, the program product comprising program instructions which, when executed in a computer, perform the method steps of claim 13.

17. A computer program product embodied in a tangible medium, the program product comprising program instructions which, when executed in a computer, perform the method steps of claim 12.

* * * * *